United States Patent
Guard

(10) Patent No.: US 9,471,185 B2
(45) Date of Patent: Oct. 18, 2016

(54) FLEXIBLE TOUCH SENSOR INPUT DEVICE

(75) Inventor: David Brent Guard, Southhampton (GB)

(73) Assignee: Atmel Corporation, San Jose, CA (US)

( * ) Notice: Subject to any disclaimer, the term of this patent is extended or adjusted under 35 U.S.C. 154(b) by 566 days.

(21) Appl. No.: 13/400,810

(22) Filed: Feb. 21, 2012

(65) Prior Publication Data

US 2013/0215035 A1   Aug. 22, 2013

(51) Int. Cl.
| | | |
|---|---|---|
| *G06F 3/044* | (2006.01) | |
| *G06F 3/02* | (2006.01) | |
| *H03K 17/96* | (2006.01) | |

(52) U.S. Cl.
CPC ............ *G06F 3/044* (2013.01); *G06F 3/0221* (2013.01); *G06F 2203/04102* (2013.01); *H03K 17/9622* (2013.01); *H03K 2017/9602* (2013.01); *H03K 2217/960785* (2013.01)

(58) Field of Classification Search
CPC .... G06F 3/0221; G06F 3/0216; G06F 3/044; G06F 2203/04102; H03K 2217/9607; H03K 2217/960785; H03K 17/962; H03K 17/9622; H03K 2017/96; H03K 2017/9602
USPC ...................... 345/156–184; 178/18.01–20.04
See application file for complete search history.

(56) References Cited

U.S. PATENT DOCUMENTS

| | | | | |
|---|---|---|---|---|
| 5,449,427 | A * | 9/1995 | Wojnarowski et al. | 156/155 |
| 5,666,112 | A * | 9/1997 | Crowley et al. | 341/22 |
| 7,369,321 | B1 * | 5/2008 | Ren et al. | 359/666 |
| 7,663,607 | B2 | 2/2010 | Hotelling | |
| 7,732,974 | B1 * | 6/2010 | Boland et al. | 310/309 |
| 7,875,814 | B2 | 1/2011 | Chen | |
| 7,920,129 | B2 | 4/2011 | Hotelling | |
| 7,932,898 | B2 * | 4/2011 | Philipp et al. | 345/174 |
| 8,031,094 | B2 | 10/2011 | Hotelling | |
| 8,031,174 | B2 | 10/2011 | Hamblin | |
| 8,040,326 | B2 | 10/2011 | Hotelling | |
| 8,049,732 | B2 | 11/2011 | Hotelling | |
| 8,106,324 | B2 * | 1/2012 | Lai et al. | 200/600 |
| 8,179,381 | B2 | 5/2012 | Frey | |
| 8,537,136 | B2 * | 9/2013 | Sekiguchi et al. | 345/174 |
| 2004/0017362 | A1 * | 1/2004 | Mulligan et al. | 345/173 |
| 2005/0156906 | A1 * | 7/2005 | Chiu et al. | 345/173 |
| 2005/0230767 | A1 * | 10/2005 | Park et al. | 257/414 |
| 2006/0097991 | A1 * | 5/2006 | Hotelling et al. | 345/173 |
| 2007/0257894 | A1 * | 11/2007 | Philipp | 345/173 |

(Continued)

FOREIGN PATENT DOCUMENTS

| | | | |
|---|---|---|---|
| JP | 2010079734 A | * | 4/2010 |
| WO | WO 2012/129247 | | 9/2012 |

OTHER PUBLICATIONS

U.S. Appl. No. 61/454,936, filed Mar. 21, 2011, Myers.

(Continued)

*Primary Examiner* — Patrick F Marinelli
(74) *Attorney, Agent, or Firm* — Baker Botts L.L.P.

(57) ABSTRACT

In one embodiment, an input device includes a flexible outer layer and a flexible touch sensor layer. The flexible outer layer is formed from a solidified material. The flexible touch sensor includes a substrate and a plurality of electrodes coupled to at least one side of the substrate. The electrodes are operable to detect touches of the flexible outer layer. Each of the electrodes have a shape formed by a plurality of lines of metal, which may be fine lines of metal (FLM), that occupy less than 100% of the area of the shape of the electrode.

18 Claims, 7 Drawing Sheets

(56) References Cited

U.S. PATENT DOCUMENTS

| | | | |
|---|---|---|---|
| 2008/0006453 A1* | 1/2008 | Hotelling | G06F 3/044 178/18.06 |
| 2008/0138589 A1* | 6/2008 | Wakabayashi et al. | 428/195.1 |
| 2008/0158181 A1* | 7/2008 | Hamblin et al. | 345/173 |
| 2008/0252614 A1* | 10/2008 | Tatehata et al. | 345/174 |
| 2009/0002331 A1* | 1/2009 | Kamiya et al. | 345/173 |
| 2009/0085885 A1* | 4/2009 | Wu et al. | 345/173 |
| 2009/0174673 A1* | 7/2009 | Ciesla | G06F 3/0202 345/173 |
| 2009/0174687 A1* | 7/2009 | Ciesla | G06F 3/04886 345/174 |
| 2009/0314621 A1* | 12/2009 | Hotelling | G06F 3/0416 200/600 |
| 2009/0315854 A1 | 12/2009 | Matsuo | |
| 2010/0164889 A1* | 7/2010 | Hristov et al. | 345/173 |
| 2010/0265212 A1* | 10/2010 | Sekiguchi et al. | 345/174 |
| 2011/0057899 A1* | 3/2011 | Sleeman et al. | 345/174 |
| 2011/0193793 A1* | 8/2011 | An et al. | 345/173 |
| 2011/0227866 A1* | 9/2011 | Kawaguchi et al. | 345/174 |
| 2011/0279250 A1* | 11/2011 | Ryhanen et al. | 340/407.2 |
| 2012/0127117 A1* | 5/2012 | Ku et al. | 345/174 |
| 2012/0242588 A1 | 9/2012 | Myers | |
| 2012/0242592 A1* | 9/2012 | Rothkopf et al. | 345/173 |
| 2012/0243151 A1 | 9/2012 | Lynch | |
| 2012/0243719 A1 | 9/2012 | Franklin | |
| 2013/0076612 A1 | 3/2013 | Myers | |
| 2013/0215035 A1* | 8/2013 | Guard | 345/168 |
| 2013/0258570 A1* | 10/2013 | Nashiki et al. | 361/679.01 |

OTHER PUBLICATIONS

U.S. Appl. No. 61/454,950, filed Mar. 21, 2011, Lynch.
U.S. Appl. No. 61/454,894, filed Mar. 21, 2011, Rothkopf.

* cited by examiner

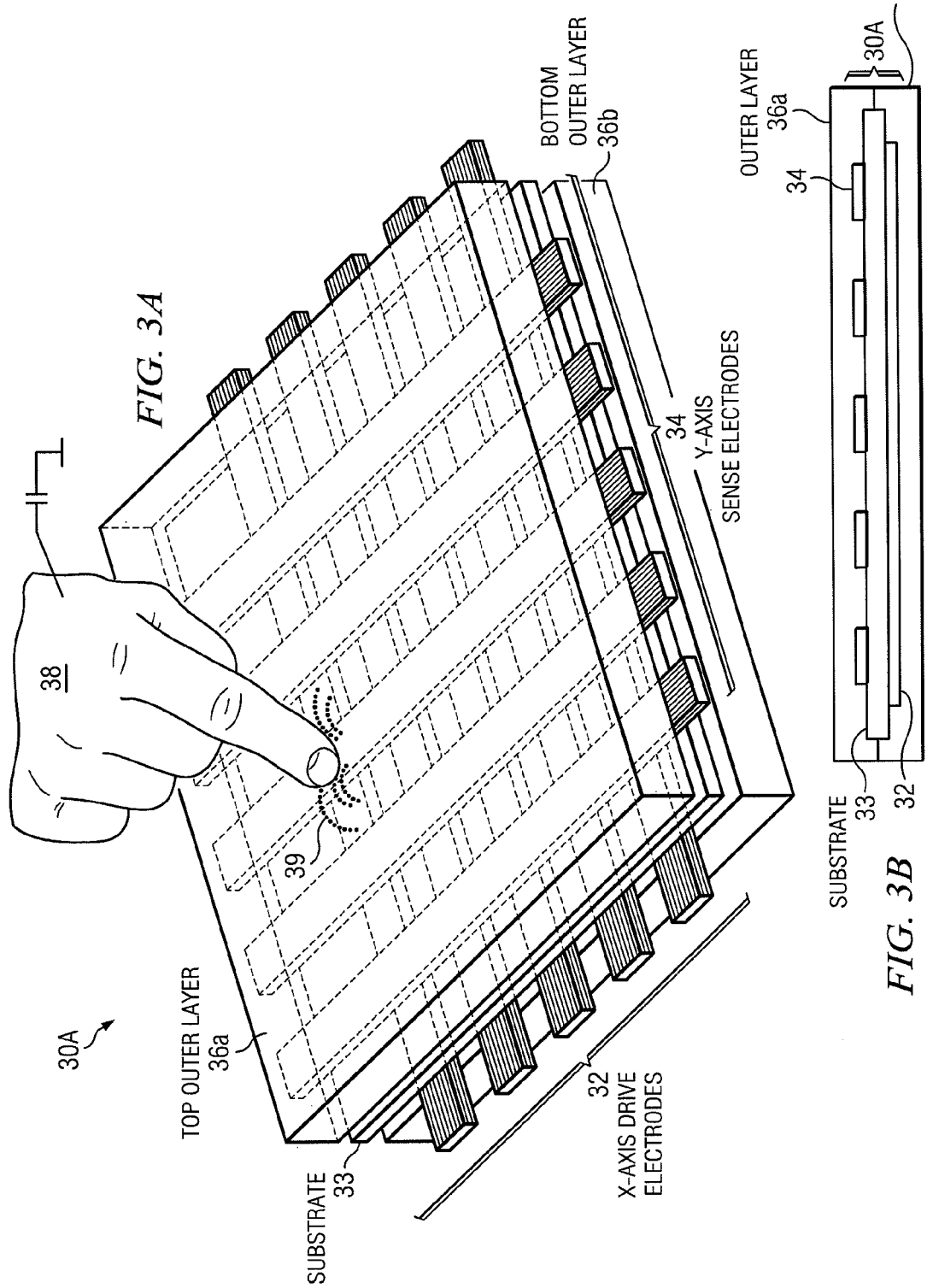

FLEXIBLE TOUCH SENSOR INPUT DEVICE

TECHNICAL FIELD

This disclosure generally relates to touch sensors.

BACKGROUND

A touch sensor may detect the presence and location of a touch or the proximity of an object (such as a user's finger or a stylus) within a touch-sensitive area of the touch sensor overlaid on a display screen, for example. In a touch-sensitive-display application, the touch sensor may enable a user to interact directly with what is displayed on the screen, rather than indirectly with a mouse or touch pad. A touch sensor may be attached to or provided as part of a desktop computer, laptop computer, tablet computer, personal digital assistant (PDA), smartphone, satellite navigation device, portable media player, portable game console, kiosk computer, point-of-sale device, or other suitable device. A control panel on a household or other appliance may include a touch sensor.

There are a number of different types of touch sensors, such as (for example) resistive touch sensors, surface acoustic wave touch sensors, and capacitive touch sensors. When an object touches or comes within proximity of the surface of the capacitive touch sensor, a change in capacitance may occur within the touch sensor at the location of the touch or proximity. A touch-sensor controller may process the change in capacitance to determine its position on the touch sensor.

BRIEF DESCRIPTION OF THE DRAWINGS

FIGS. 3A and 3B illustrate an example dual-sided embodiment of the touch sensor of FIG. 1, according to certain embodiments;

DESCRIPTION OF EXAMPLE EMBODIMENTS

Certain embodiments disclosed herein provide a flexible keyboard having an enclosed touch sensor and a method of manufacturing the same. Some embodiments of the touch sensor of the flexible keyboard include electrodes that are formed with fine lines of metal (FLM), having a width from about 2 μm to about 10 μm. The touch sensor of the flexible keyboard may be any appropriate touch sensor including, but not limited to, a dual-sided and a single-sided touch sensor. While some embodiments of the flexible keyboard are flat, some embodiments include one or more three-dimensional protrusions and/or indentations for increased ergonomics and tactile feel. For example, some embodiments include three-dimensional keyboard keys and/or one or more three-dimensional position sensors such as dials. Some embodiments utilize an in-mould lamination (IML) process to form the flexible keyboard.

Figure 1:
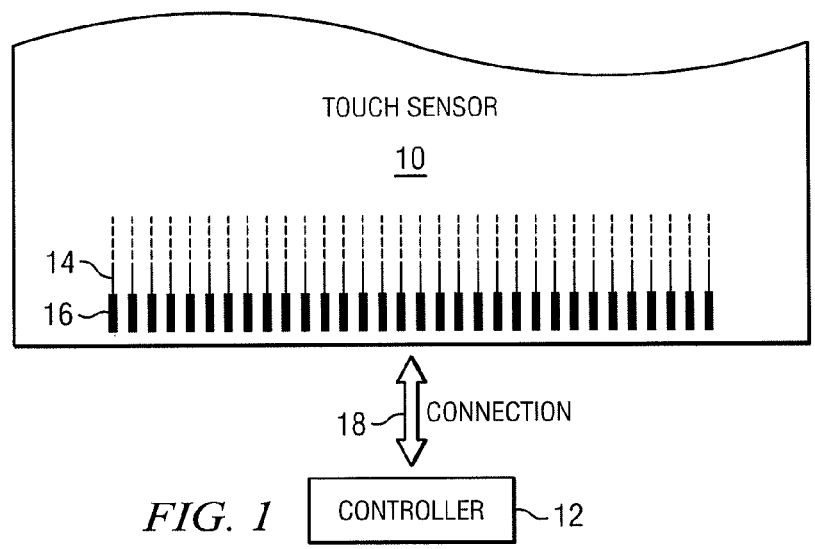
FIG. 1 illustrates an example touch sensor, according to certain embodiments.

FIG. 1 illustrates an example touch sensor 10 with an example touch-sensor controller 12. Touch sensor 10 and touch-sensor controller 12 may detect the presence and location of a touch or the proximity of an object within a touch-sensitive area of touch sensor 10. Herein, reference to a touch sensor may encompass both the touch sensor and its touch-sensor controller, where appropriate. Similarly, reference to a touch-sensor controller may encompass both the touch-sensor controller and its touch sensor, where appropriate. Touch sensor 10 may include one or more touch-sensitive areas, where appropriate. Touch sensor 10 may include an array of drive and sense electrodes (or an array of electrodes of a single type) disposed on one or more substrates, which may be made of a dielectric material. Herein, reference to a touch sensor may encompass both the electrodes of the touch sensor and the substrate(s) that they are disposed on, where appropriate. Alternatively, where appropriate, reference to a touch sensor may encompass the electrodes of the touch sensor, but not the substrate(s) that they are disposed on.

An electrode (whether a drive electrode or a sense electrode) may be an area of conductive material forming a shape, such as for example a disc, square, rectangle, thin line other suitable shape, or suitable combination of these. One or more cuts in one or more layers of conductive material may (at least in part) create the shape of an electrode, and the area of the shape may (at least in part) be bounded by those cuts. In particular embodiments, the conductive material of an electrode may occupy approximately 100% of the area of its shape. As an example and not by way of limitation, an electrode may be made of indium tin oxide (ITO) and the ITO of the electrode may occupy approximately 100% of the area of its shape (sometimes referred to as 100% fill), where appropriate. In particular embodiments, the conductive material of an electrode may occupy substantially less than 100% of the area of its shape. As an example and not by way of limitation, an electrode may be made of FLM or other conductive material, such as for example copper, silver, or a copper- or silver-based material, and the fine lines of conductive material may occupy approximately 1% to 10% of the area of its shape in a hatched, mesh, or other suitable pattern. Herein, reference to FLM encompasses such material, where appropriate. Although this disclosure describes or illustrates particular electrodes made of particular conductive material forming particular shapes with particular fills having particular patterns, this disclosure contemplates any suitable electrodes made of any suitable conductive material forming any suitable shapes with any suitable fill percentages having any suitable patterns.

Where appropriate, the shapes of the electrodes (or other elements) of a touch sensor may constitute in whole or in part one or more macro-features of the touch sensor. One or more characteristics of the implementation of those shapes (such as, for example, the conductive materials, fills, or patterns within the shapes) may constitute in whole or in part one or more micro-features of the touch sensor. One or more macro-features of a touch sensor may determine one or more characteristics of its functionality, and one or more microfeatures of the touch sensor may determine one or more optical features of the touch sensor, such as transmittance, refraction, or reflection.

A mechanical stack may contain the substrate (or multiple substrates) and the conductive material forming the drive or sense electrodes of touch sensor 10. As an example and not by way of limitation, the mechanical stack may include a first layer of optically clear adhesive (OCA) beneath a cover panel. The cover panel may be clear and made of a resilient material suitable for repeated touching, such as for example glass, polycarbonate, or poly(methyl methacrylate) (PMMA). This disclosure contemplates any suitable cover panel made of any suitable material. The first layer of OCA may be disposed between the cover panel and the substrate with the conductive material forming the drive or sense electrodes. The mechanical stack may also include a second layer of OCA and a dielectric layer (which may be made of polyethylene terephthalate (PET) or another suitable material, similar to the substrate with the conductive material forming the drive or sense electrodes). As an alternative, where appropriate, a thin coating of a dielectric material may be applied instead of the second layer of OCA and the dielectric layer. The second layer of OCA may be disposed between the substrate with the conductive material making up the drive or sense electrodes and the dielectric layer, and the dielectric layer may be disposed between the second layer of OCA and an air gap to an outer layer of a device including touch sensor 10 and touch-sensor controller 12. As an example only and not by way of limitation, the cover panel may have a thickness of approximately 1 mm; the first layer of OCA may have a thickness of approximately 0.05 mm; the substrate with the conductive material forming the drive or sense electrodes may have a thickness of approximately 0.05 mm; the second layer of OCA may have a thickness of approximately 0.05 mm; and the dielectric layer may have a thickness of approximately 0.05 mm. Although this disclosure describes a particular mechanical stack with a particular number of particular layers made of particular materials and having particular thicknesses, this disclosure contemplates any suitable mechanical stack with any suitable number of any suitable layers made of any suitable materials and having any suitable thicknesses. As an example and not by way of limitation, in particular embodiments, a layer of adhesive or dielectric may replace the dielectric layer, second layer of OCA, and air gap described above, with there being no air gap to the display.

One or more portions of the substrate of touch sensor 10 may be made of PET or another suitable material. This disclosure contemplates any suitable substrate with any suitable portions made of any suitable material. In particular embodiments, the drive or sense electrodes in touch sensor 10 may be made of ITO in whole or in part. In particular embodiments, the drive or sense electrodes in touch sensor 10 may be made of fine lines of metal or other conductive material. As an example and not by way of limitation, one or more portions of the conductive material may be copper or copper-based and have a thickness of approximately 5 µm or less and a width of approximately 10 µm or less. As another example, one or more portions of the conductive material may be silver or silver-based and similarly have a thickness of approximately 5 µm or less and a width of approximately 10 µm or less. This disclosure contemplates any suitable electrodes made of any suitable material.

Touch sensor 10 may implement a capacitive form of touch sensing. In a mutual-capacitance implementation, touch sensor 10 may include an array of drive and sense electrodes forming an array of capacitive nodes. A drive electrode and a sense electrode may form a capacitive node. The drive and sense electrodes forming the capacitive node may come near each other, but not make electrical contact with each other. Instead, the drive and sense electrodes may be capacitively coupled to each other across a space between them. A pulsed or alternating voltage applied to the drive electrode (by touch-sensor controller 12) may induce a charge on the sense electrode, and the amount of charge induced may be susceptible to external influence (such as a touch or the proximity of an object). When an object touches or comes within proximity of the capacitive node, a change in capacitance may occur at the capacitive node and touch-sensor controller 12 may measure the change in capacitance. By measuring changes in capacitance throughout the array, touch-sensor controller 12 may determine the position of the touch or proximity within the touch-sensitive area(s) of touch sensor 10.

In a self-capacitance implementation, touch sensor 10 may include an array of electrodes of a single type that may each form a capacitive node. When an object touches or comes within proximity of the capacitive node, a change in self-capacitance may occur at the capacitive node and touch-sensor controller 12 may measure the change in capacitance, for example, as a change in the amount of charge needed to raise the voltage at the capacitive node by a pre-determined amount. As with a mutual-capacitance implementation, by measuring changes in capacitance throughout the array, touch-sensor controller 12 may determine the position of the touch or proximity within the touch-sensitive area(s) of touch sensor 10. This disclosure contemplates any suitable form of capacitive touch sensing, where appropriate.

In particular embodiments, one or more drive electrodes may together form a drive line running horizontally or vertically or in any suitable orientation. Similarly, one or more sense electrodes may together form a sense line running horizontally or vertically or in any suitable orientation. In particular embodiments, drive lines may run substantially perpendicular to sense lines. Herein, reference to a drive line may encompass one or more drive electrodes making up the drive line, and vice versa, where appropriate. Similarly, reference to a sense line may encompass one or more sense electrodes making up the sense line, and vice versa, where appropriate.

Touch sensor 10 may have drive and sense electrodes disposed in a pattern on one side of a single substrate. In such a configuration, a pair of drive and sense electrodes capacitively coupled to each other across a space between them may form a capacitive node. For a self-capacitance implementation, electrodes of only a single type may be disposed in a pattern on a single substrate. In addition or as an alternative to having drive and sense electrodes disposed in a pattern on one side of a single substrate, touch sensor 10 may have drive electrodes disposed in a pattern on one side of a substrate and sense electrodes disposed in a pattern on another side of the substrate. Moreover, touch sensor 10 may have drive electrodes disposed in a pattern on one side of one substrate and sense electrodes disposed in a pattern on one side of another substrate. In such configurations, an intersection of a drive electrode and a sense electrode may form a capacitive node. Such an intersection may be a location where the drive electrode and the sense electrode "cross" or come nearest each other in their respective planes. The drive and sense electrodes do not make electrical contact with each other—instead they are capacitively coupled to each other across a dielectric at the intersection. Although this disclosure describes particular configurations of particular electrodes forming particular nodes, this disclosure contemplates any suitable configuration of any suitable electrodes forming any suitable nodes. Moreover, this disclosure contemplates any suitable electrodes disposed on any suitable number of any suitable substrates in any suitable patterns.

As described above, a change in capacitance at a capacitive node of touch sensor 10 may indicate a touch or proximity input at the position of the capacitive node. Touch-sensor controller 12 may detect and process the change in capacitance to determine the presence and location of the touch or proximity input. Touch-sensor controller 12 may then communicate information about the touch or proximity input to one or more other components (such one or more central processing units (CPUs)) of a device that includes touch sensor 10 and touch-sensor controller 12, which may respond to the touch or proximity input by initiating a function of the device (or an application running on the device). Although this disclosure describes a particular touch-sensor controller having particular functionality with respect to a particular device and a particular touch sensor, this disclosure contemplates any suitable touch-sensor controller having any suitable functionality with respect to any suitable device and any suitable touch sensor.

Touch-sensor controller 12 may be one or more integrated circuits (ICs), such as for example general-purpose microprocessors, microcontrollers, programmable logic devices or arrays, application-specific ICs (ASICs). In particular embodiments, touch-sensor controller 12 comprises analog circuitry, digital logic, and digital non-volatile memory. In particular embodiments, touch-sensor controller 12 is disposed on a flexible printed circuit (FPC) bonded to and/or held in compression against the substrate of touch sensor 10, as described below. The FPC may be active or passive, where appropriate. In particular embodiments, multiple touch-sensor controllers 12 are disposed on the FPC. Touch-sensor controller 12 may include a processor unit, a drive unit, a sense unit, and a storage unit. The drive unit may supply drive signals to the drive electrodes of touch sensor 10. The sense unit may sense charge at the capacitive nodes of touch sensor 10 and provide measurement signals to the processor unit representing capacitances at the capacitive nodes. The processor unit may control the supply of drive signals to the drive electrodes by the drive unit and process measurement signals from the sense unit to detect and process the presence and location of a touch or proximity input within the touch-sensitive area(s) of touch sensor 10. The processor unit may also track changes in the position of a touch or proximity input within the touch-sensitive area(s) of touch sensor 10. The storage unit may store programming for execution by the processor unit, including programming for controlling the drive unit to supply drive signals to the drive electrodes, programming for processing measurement signals from the sense unit, and other suitable programming, where appropriate. Although this disclosure describes a particular touch-sensor controller having a particular implementation with particular components, this disclosure contemplates any suitable touch-sensor controller having any suitable implementation with any suitable components.

Tracks 14 of conductive material disposed on the substrate of touch sensor 10 may couple the drive or sense electrodes of touch sensor 10 to connection pads 16, also disposed on the substrate of touch sensor 10. As described below, connection pads 16 facilitate coupling of tracks 14 to touch-sensor controller 12. Tracks 14 may extend into or around (e.g. at the edges of) the touch-sensitive area(s) of touch sensor 10. Particular tracks 14 may provide drive connections for coupling touch-sensor controller 12 to drive electrodes of touch sensor 10, through which the drive unit of touch-sensor controller 12 may supply drive signals to the drive electrodes. Other tracks 14 may provide sense connections for coupling touch-sensor controller 12 to sense electrodes of touch sensor 10, through which the sense unit of touch-sensor controller 12 may sense charge at the capacitive nodes of touch sensor 10. Tracks 14 may be made of fine lines of metal or other conductive material. As an example and not by way of limitation, the conductive material of tracks 14 may be copper or copper-based and have a width of approximately 10 μm to 100 μm. As another example, the conductive material of tracks 14 may be silver or silver-based and have a width of approximately 30 μm to 100 μm. In particular embodiments, tracks 14 may be made of ITO in whole or in part in addition or as an alternative to fine lines of metal or other conductive material. Although this disclosure describes particular tracks made of particular materials with particular widths, this disclosure contemplates any suitable tracks made of any suitable materials with any suitable widths. In addition to tracks 14, touch sensor 10 may include one or more ground lines terminating at a ground connector (which may be a connection pad 16) at an edge of the substrate of touch sensor 10 (similar to tracks 14).

Connection pads 16 may be located along one or more edges of the substrate, outside the touch-sensitive area(s) of touch sensor 10. As described above, touch-sensor controller 12 may be on an FPC. Connection pads 16 may be made of the same material as tracks 14 and may be bonded to the FPC using an anisotropic conductive film (ACF). Connection 18 may include conductive lines on the FPC coupling touch-sensor controller 12 to connection pads 16, in turn coupling touch-sensor controller 12 to tracks 14 and to the drive or sense electrodes of touch sensor 10. In another embodiment, connection pads 16 may be connected to an electro-mechanical connector (such as a zero insertion force wire-to-board connector); in this embodiment, connection 18 may not need to include an FPC. This disclosure contemplates any suitable connection 18 between touch-sensor controller 12 and touch sensor 10.

Figure 2:
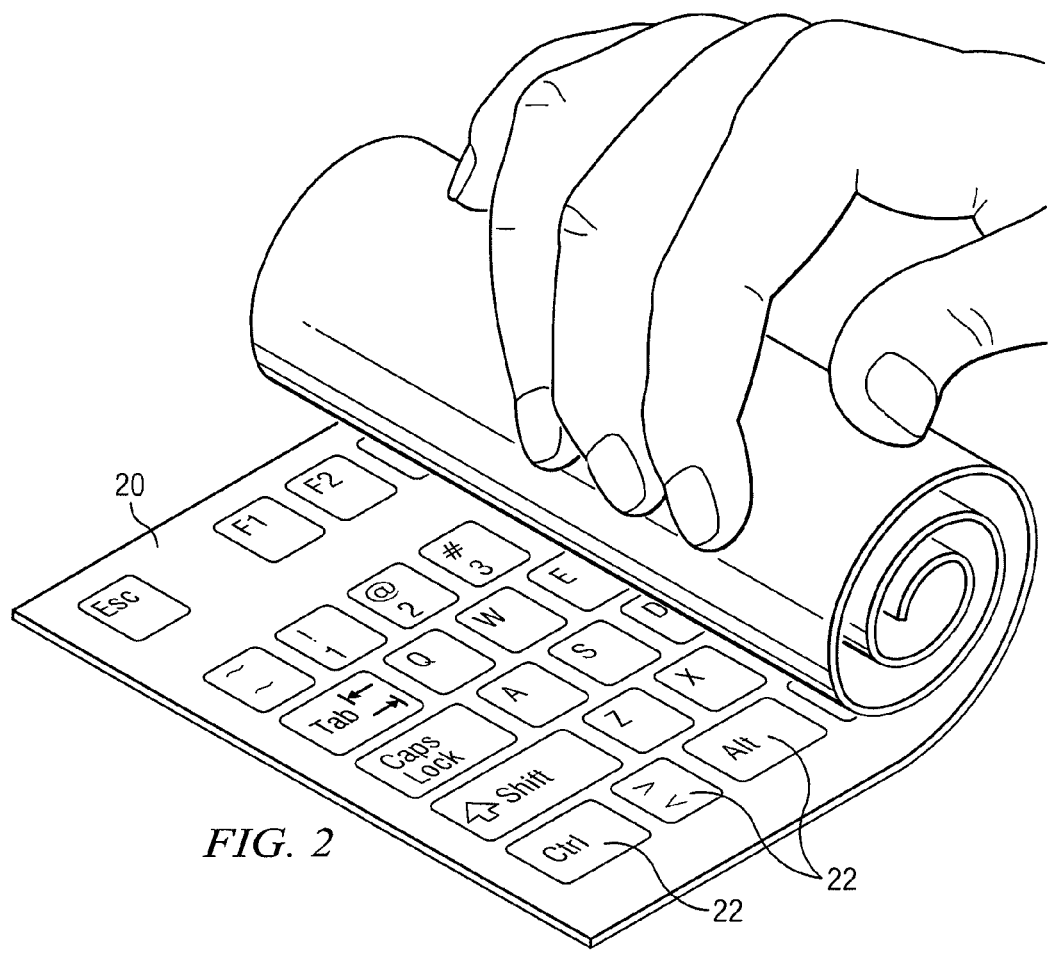
FIG. 2 illustrates an example flexible keyboard that utilizes the touch sensor of FIG. 1, according to certain embodiments.

FIG. 2 illustrates an example flexible keyboard 20 that may utilize touch sensor 10 of FIG. 1. Flexible keyboard 20 may be any form of keyboard that may be used by a user to input data into a computer, personal digital assistant, cellular telephone, smartphone, tablet computer, and the like. The keyboard's touch input elements (including keys, dials, sliders and other parts of the keyboard that accept user touch inputs) can be made of any suitable material having an appropriately high dielectric constant, preferably above about 3. In certain embodiments, the entire outer surface of the keyboard, including the touch input elements, can be made from the same material, in which case that material can have a dielectric constant above about 3. In certain other embodiments, the touch input elements can be made from a different material than the body the keyboard. In these embodiments, it is possible to use a non-flexible material for the touch input elements (e.g., polyester inserts, glass, impregnated carbon, etc.) while using a flexible material such as rubber for the body. In some embodiments, materials that are non-flexible when they are sufficiently thick (e.g., PET, PMMA, etc.) may be used for the touch input elements. The body of flexible keyboard 20 may be made of rubber, a resin, silicone, or any other appropriate material that is both flexible and appropriate for a keyboard. In some embodiments, flexible keyboard 20 is opaque and may be any appropriate color (e.g., black). In other embodiments, flexible keyboard 20 is transparent. Flexible keyboard 20 can be seamless (i.e., the outer surface of flexible keyboard 20 is continuous) and impenetrable to water. As a result, flexible keyboard 20 may be washed clean with water and is spill-resistant.

In some embodiments, flexible keyboard 20 includes keys 22 that are three-dimensional (i.e., keys 22 are protrusions that protrude above or below the outer surface of flexible keyboard 20) to improve the ergonomics and tactile feel of flexible keyboard 20. In other embodiments, flexible keyboard 20 is a flat mat as illustrated in FIG. 2 (i.e., the outer surface of flexible keyboard 20 is smooth and is void of any three-dimensional protrusions). In some embodiments, flexible keyboard 20 may include a graphics layer that indicates the outlines of keys 22.

In general, flexible keyboard 20 includes an outer surface that includes the touch input elements (which may be flexible, or substantially inflexible) with which a user interacts, and a flexible touch sensor layer that is disposed inside flexible keyboard 20 and detects touches of the outer layer of flexible keyboard 20. As discussed further below, some embodiments of flexible keyboard 20 include a sensor layer that is a single-sided sensor. In other embodiments, flexible keyboard 20 includes a sensor layer that is a dual-sided sensor. In some embodiments, the sensor layer of flexible keyboard 20 is approximately 50 μm to approximately 200 μm thick.

FIGS. 3A and 3B illustrate a perspective view and a side view, respectively, of a dual-sided touch sensor layer 30a that may be utilized in flexible keyboard 20. In some embodiments, dual-sided touch sensor layer 30a is substantially similar to touch sensor 10 described above in reference to FIG. 1. Dual-sided touch sensor layer 30a includes drive electrodes 32, a flexible substrate 33, and sense electrodes 34. When disposed in flexible keyboard 20, dual-sided touch sensor layer 30a is generally sandwiched by a flexible outer layer 36. In some embodiments, outer layer 36 may include a top outer layer 36a and a bottom outer layer 36b. While outer layer 36 is transparent in some embodiments, in other embodiments outer layer 36 is opaque and may be any color such as black. In some embodiments, substrate 33 is sandwiched between drive electrodes 32 and sense electrodes 34, and sense electrodes 34 are coupled to an underside of outer layer 36. In other embodiments, dual-sided touch sensor layer 30a may include any appropriate configuration and number of layers of electrodes and substrates.

In applications where touch sensor layers are disposed over device displays, such as over the display of a smartphone or tablet, the optical properties of the touch sensor layer are important. As it is often desirable for the touch sensor layer to have high optical transmissivity, if the touch sensor electrodes are made of opaque materials such as metal, it is desirable to reduce the width of the lines and increase their spacing, such as in FLM sensors described above. The flexible keyboard 20 does not have the same transmissivity requirements for the touch sensor layer. Particularly in the opaque-outer-layer embodiments, the diameter of the electrode lines is not important, even for aesthetic purposes, and thus the electrode lines do not need to "fine" lines, and can be made relatively wider and/or more closely spaced than in applications which require high light transmissivity through the touch sensor layer. In transparent-outer-layer embodiments, the metal lines will be visible, so the width and spacing of the electrode lines can be selected in view of desired aesthetics.

In certain embodiments, electrodes 32 and 34 may be configured in a manner substantially similar to the drive and sense electrodes, respectively, described above with reference to FIG. 1, and a touch object 38 (e.g., a finger or a stylus) may be capacitively coupled to ground. In certain embodiments, sense electrodes 34 may determine the location of touch object 38 at least in part by using controller 12 to apply a pulsed or alternating voltage to drive electrodes 32, which may induce a charge on sense electrodes 34. When touch object 38 touches or comes within proximity of an active area of dual-sided touch sensor layer 30a, a change in capacitance may occur, as depicted by electric field lines 39 in FIG. 3A. The change in capacitance may be sensed by sense electrodes 34 and measured by controller 12. By measuring changes in capacitance throughout an array of sense electrodes 34, controller 12 may determine the position of the touch or proximity within the touch-sensitive area(s) of dual-sided touch sensor layer 30a. For example, controller 12 may determine which key 22 of flexible keyboard 20 has been pressed by touch object 38 by determining the position of the touch or proximity on the outer layer 36 of flexible keyboard 20.

Figure 4A:
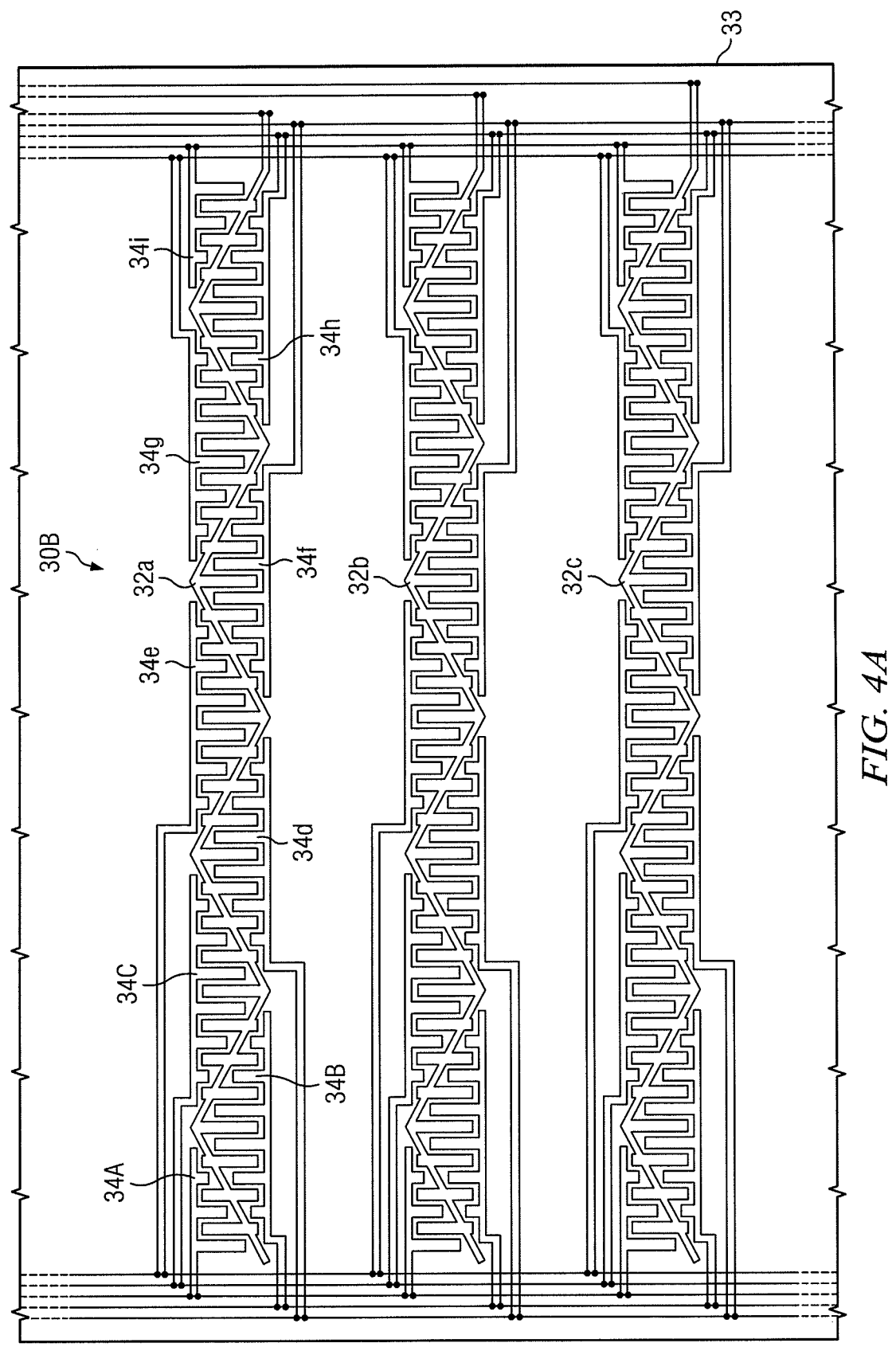
FIGS. 4A through 4C illustrate example single-sided embodiments of the touch sensor of FIG. 1, according to certain embodiments.
Figure 4B:
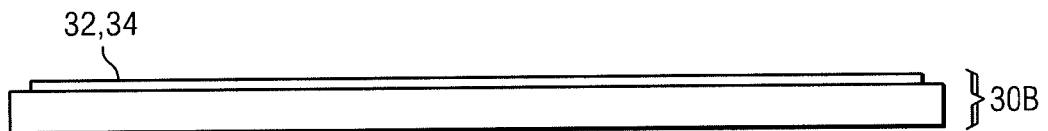
Figure 4C:
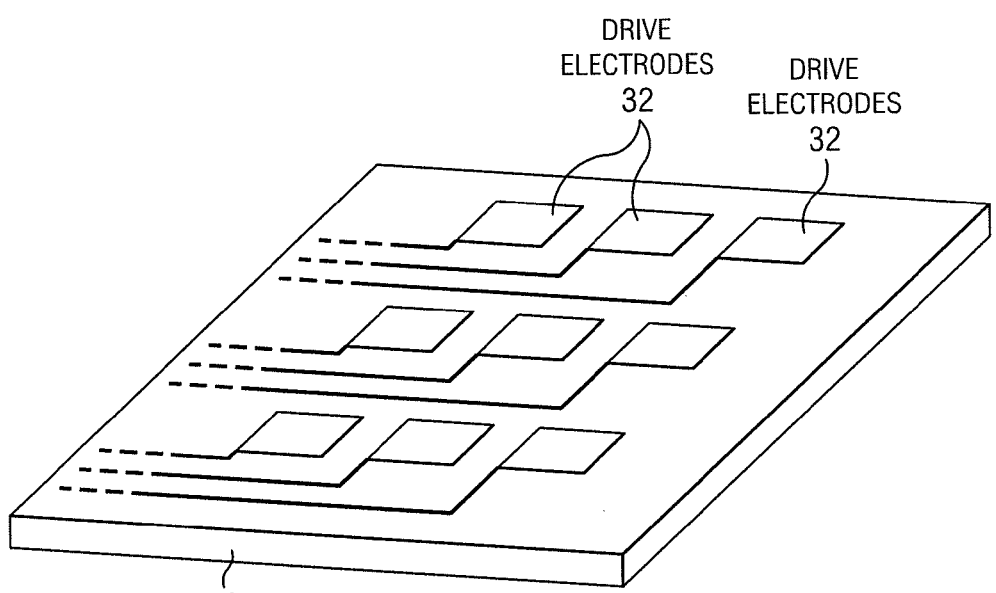

FIGS. 4A and 4B illustrate a top view and a side view, respectively, of a single-sided touch sensor layer 30b that may be utilized in flexible keyboard 20. In some embodiments, single-sided touch sensor layer 30b is substantially similar to touch sensor 10 described above in reference to FIG. 1. Similar to dual-sided touch sensor layer 30a, some embodiments of single-sided touch sensor layer 30b include drive electrodes 32 (e.g., drive electrodes 32a-32c), flexible substrate 33, and sense electrodes 34 (e.g., sense electrodes 34a-34i). Unlike dual-sided touch sensor layer 30a, however, single-sided touch sensor layer 30b includes electrodes on only one side of substrate 33. In a mutual-capacitance embodiment as shown in FIG. 4A, for example, single-sided touch sensor layer 30b includes drive electrodes 32 and sense electrodes 34 disposed in a pattern on one side of substrate 33. In such a configuration, a pair of drive and sense electrodes capacitively coupled to each other across a space between them forms a capacitive node. In a self-capacitance embodiment, single-sided touch sensor layer 30b includes electrodes of only a single type (e.g. drive) disposed in a pattern on one side of substrate 33, as shown in FIG. 4C. Although this disclosure describes particular configurations of particular electrodes forming particular nodes, this disclosure contemplates any suitable configuration of any suitable electrodes forming any suitable nodes. Moreover, this disclosure contemplates any suitable electrodes disposed on any suitable number of any suitable substrates in any suitable patterns.

Figure 5A:
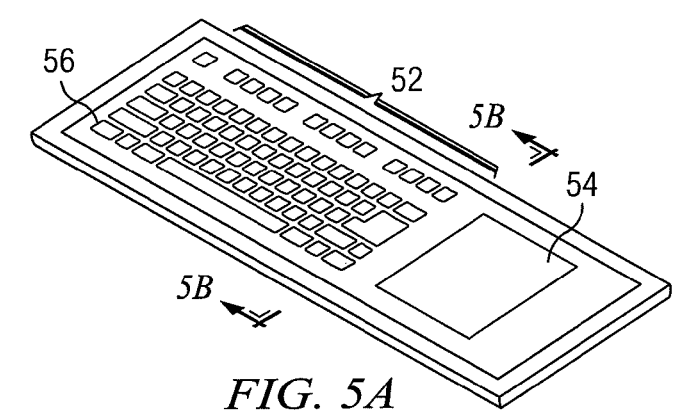
FIGS. 5A and 5B illustrate an example flat flexible keyboard that utilizes the touch sensor of FIG. 1, according to certain embodiments.
Figure 5B:
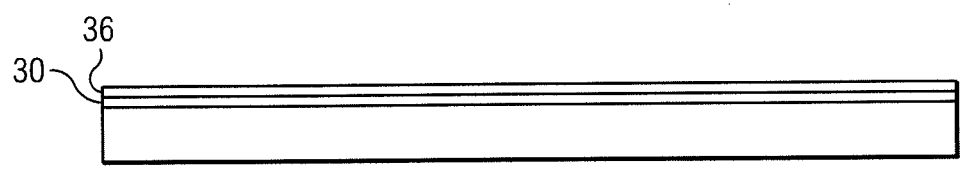

FIGS. 5A and 5B illustrate a perspective view and a side view, respectively, of a particular embodiment of flexible keyboard 20. In this embodiment, flexible keyboard 20 is a flat mat embodiment wherein an outer surface 58 of outer layer 36 is flat and does not have any protrusions that extend above or below outer surface 58. This embodiment of flexible keyboard 20 includes a keyboard area 52 and a touch pad area 54. Touch pad area 54 is an area in which a user may utilize touch object 38 (e.g., a finger) to provide an input. For example, touch pad area 54 may provide the user the capability of moving a mouse cursor across a screen by moving a finger across touch pad area 54. Touch sensor layer 30 is disposed beneath outer layer 36 and is capable of detecting a location in which a user presses outer layer 36. In some embodiments, flexible keyboard 20 includes a graphics layer 56 that indicates certain portions of keyboard area 52 and/or touch pad area 54. For example, as illustrated in FIG. 5A, some embodiments of graphics layer 56 indicate the outlines of keys 22 in keyboard area 52 and/or the outline of touch pad area 54. In some embodiments, graphics layer 56 and/or outer layer 36 may be provided using an in-mould decoration (IMD) process. In some embodiments, the IMD process may be used to form flat (e.g., not three-dimensional) keys of flexible keyboard 20.

Figure 6A:
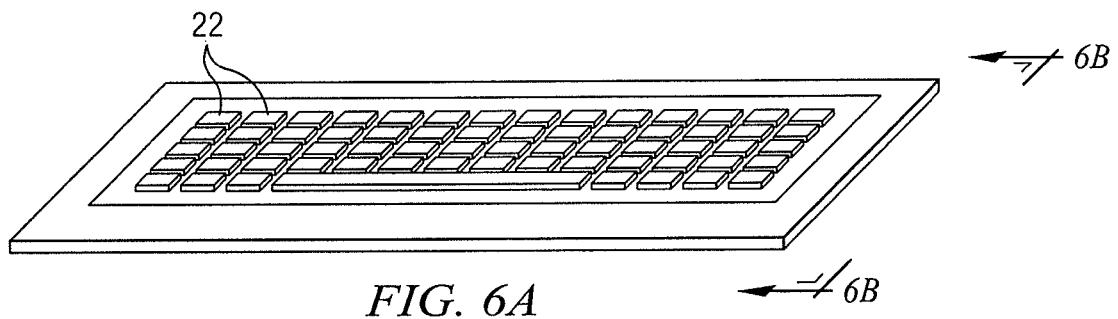
FIGS. 6A and 6B illustrate an example three-dimensional flexible keyboard that utilizes the touch sensor of FIG. 1, according to certain embodiments.
Figure 6B:
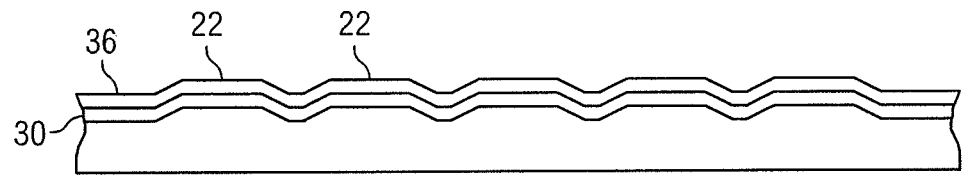

FIGS. 6A and 6B illustrate a perspective view and a side view, respectively, of another particular embodiment of flexible keyboard 20. In this embodiment, flexible keyboard 20 includes a three-dimensional keyboard area 52. In this embodiment, at least a portion of keyboard area 52 includes three-dimensional protrusions that protrude above or below outer surface 58. Each three-dimensional protrusion in keyboard area 52 corresponds to a particular key 22. The three-dimensional keys 22 provide improved ergonomics and tactile feel to embodiments of flexible keyboard 20. Touch sensor layer 30 is disposed beneath the three-dimensional protrusions of outer layer 36 and is capable of detecting when a user presses keys 22. In some embodiments, as will be explained in more detail below, an IML process may be utilized to form the three-dimensional keys 22 of flexible keyboard 20.

Figure 7:
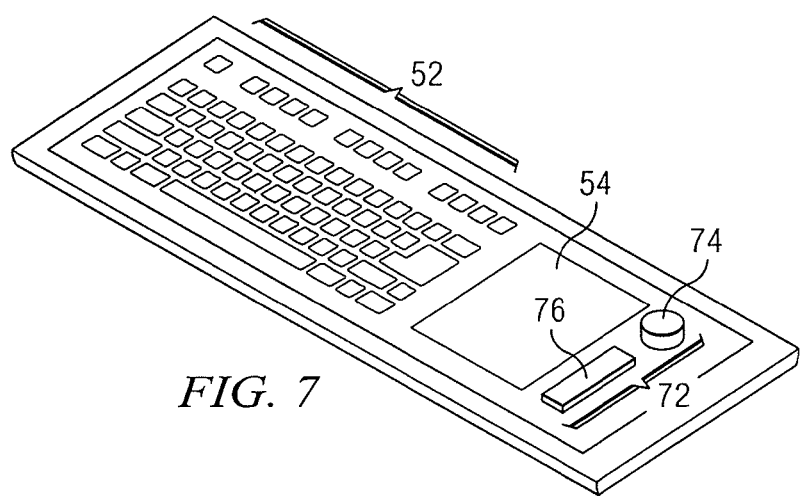
FIG. 7 illustrates an example embodiment of a flexible keyboard that includes one or more three-dimensional position sensors, according to certain embodiments.
Figure 8A:
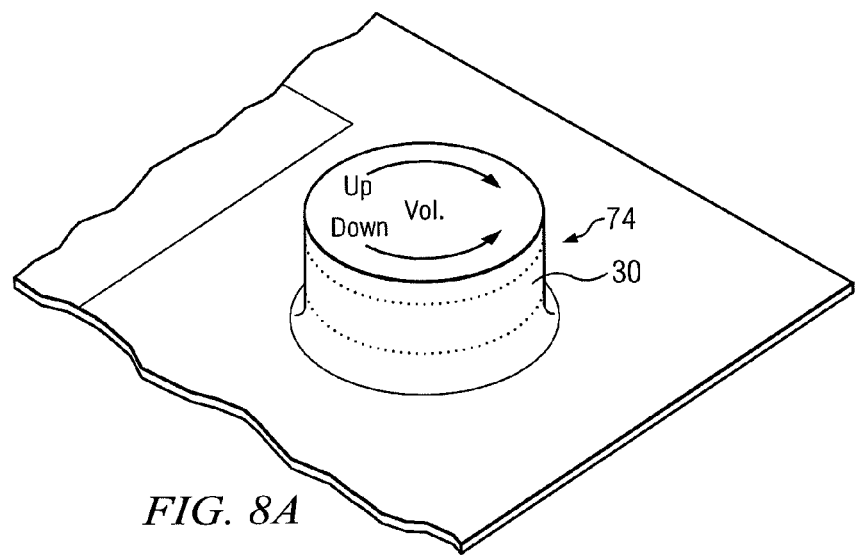
FIGS. 8A through 8C illustrate example embodiments of the three-dimensional position sensors of FIG. 7, according to certain embodiments.
Figure 8B:
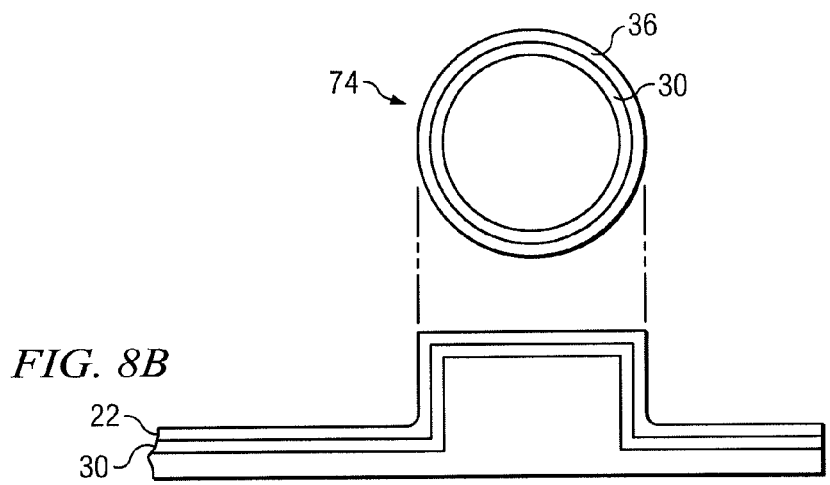

FIG. 7 illustrates an embodiment of flexible keyboard 20 that includes one or more three-dimensional position sensors 72. Position sensors 72 may include a dial 74 and/or a slider 76. Position sensors 72, like the three-dimensional keys 22 described above, are three-dimensional protrusions that protrude above or below outer surface 58. Position sensors 72 may be in any appropriate shape. For example, FIGS. 8A and 8B illustrate a dial 74 that protrudes above outer surface 58 in the shape of a cylinder. Cylindrical dial 74 is a stationary three-dimensional protrusion that is seamlessly connected to outer surface 58 of outer layer 36; it does not rotate relative to its base, as mechanical dials do. As illustrated in FIG. 8B, at least a portion of touch sensor layer 30 is disposed inside cylindrical dial 74. In operation, the portion of touch sensor layer 30 that is disposed in cylindrical dial 74 detects when one or more fingers of a user touch and/or twist around outer surface 58 of cylindrical dial 74. For example, cylindrical dial 74 may be intended as a volume control knob. In this example, a user may turn the volume up or down by twisting one or more fingers around outer surface 58 of cylindrical dial 74 as indicated in FIG. 8A. Cylindrical dial 74 remains stationary while the user twists one or more fingers around outer surface 58.

Figure 8C:
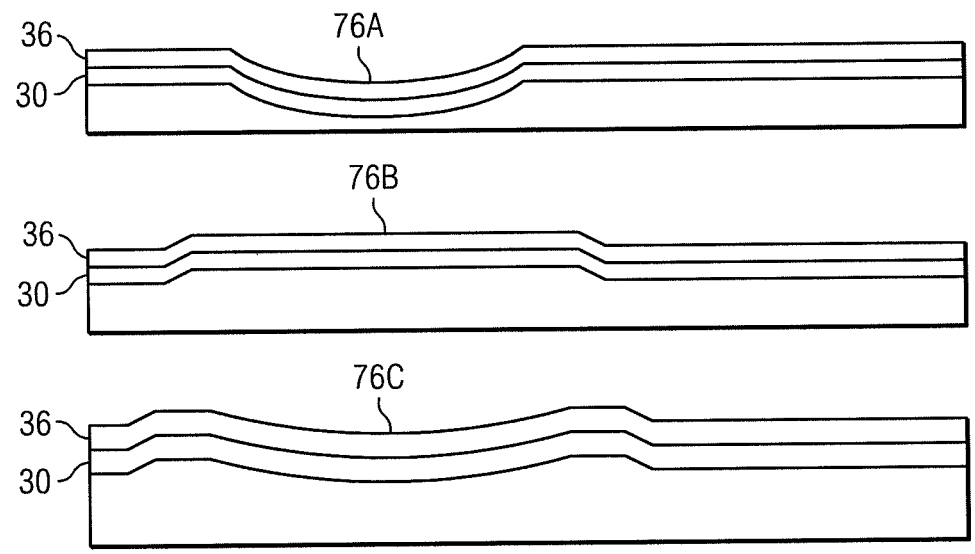

As another example of position sensors 72, FIG. 8C illustrates various embodiments of a slider 76 (e.g., sliders 76A-76C). Sliders 76A-76C are three-dimensional protrusions that protrude above or indentations that extend below outer surface 58. Sliders 76 may be rectangular or any other appropriate shape. For example, slider 76A is a rectangular indentation (when viewed from above), and sliders 76B and 76C are rectangular protrusions (when viewed from above). At least a portion of touch sensor layer 30 is disposed beneath and/or in sliders 76 and is operable to detect when a user slides a finger across sliders 76. For example, a particular slider 76 may be intended as a brightness control for a monitor. To increase the brightness of the monitor, a user would slide a finger from point 82 to point 84 (or vice versa) on a particular slider 76. The portion of touch sensor layer 30 disposed beneath the slider 76 detects the sliding finger and reports the movement to controller 12. A device (e.g., a computer) coupled to flexible keyboard 20 would ultimately receive an indication of the movement along slider 76 and adjust the brightness of the monitor accordingly.

Figure 9:
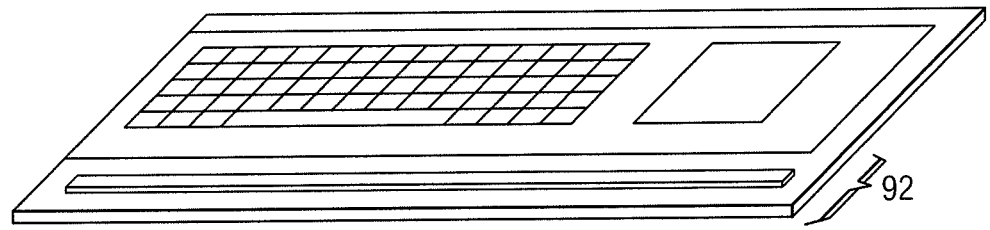
FIG. 9 illustrates an embodiment of a flexible keyboard having a wrist rest, according to certain embodiments.

FIG. 9 illustrates an embodiment of flexible keyboard 20 having a wrist rest 92. In some embodiments, wrist rest 92 is seamlessly integrated with flexible keyboard 20. In such embodiments, wrist rest 92 is an extension of outer layer 36. In certain embodiments, wrist rest 92 includes a three-dimensional protrusion as illustrated in FIG. 9. Wrist rest 92 is operable to provide support for a user's wrist as the user types on flexible keyboard 20.

In operation of example embodiments, an external object such as touch object 38 contacts or comes within close proximity to flexible keyboard 20 at a location on outer layer 36. For example, a user interacts with flexible keyboard 20 by typing on keys 22 of keyboard area 52. As another example, a user interacts with flexible keyboard 20 by moving a finger across touch pad area 54. As a result of the interaction, touch sensor layer 30 receives signals from electrodes 32/34 that indicate of an amount of capacitance between touch sensor layer 30 and the external object. For example, touch sensor layer 30 receives signals from sense electrodes 34 indicating an amount of capacitance between touch sensor layer 30 and a finger of a user that is being used to interact with flexible keyboard 20. In response to receiving the signals from electrodes 32/34 that indicate an amount of capacitance between touch sensor layer 30 and the external object, in some embodiments of a system including the touch sensor layer 30, the controller 12 accesses a threshold value (such as touch detection threshold) that is stored in one or more memory devices accessible to controller 12. The threshold value indicates a threshold magnitude of the signals from electrodes 32/34 that should be interpreted as representing a touch by the external object. If the measured capacitance is greater than the touch detection threshold, the interaction with flexible keyboard 20 is considered to represent a touch. Conversely, if the measured capacitance is less than the touch detection threshold, the interaction with flexible keyboard 20 is considered to not represent a touch.

The manufacturing process used to form flexible keyboard 20 may include the following steps. Flexible touch sensor layer 30 may be formed by forming a plurality of electrodes (e.g., electrodes 32 and/or 34) on a flexible substrate 33. In some embodiments, the electrodes are formed on only one side of substrate 33. In other embodiments, the electrodes are formed on two opposing sides of substrate 33. For flexible keyboards having three-dimensional features, the flexible touch sensor layer may be pre-shaped, for example using a vacuum forming process involving the application of heat and vacuum to shape the flexible touch sensor layer 30. The touch sensor layer 30 is placed into a mold having a desired shape of flexible keyboard 20. An IML tool may then be utilized to inject a suitable material (such as a resin, rubber, silicone, and the like) at a high temperature on and around touch sensor layer 30. In certain embodiments, all or a majority of the material injected during the IML process may be optically opaque or optically transparent. The material may be injected from various injection gates of the IML tool. As the material cools, it hardens, adheres to, and encompasses touch sensor layer 30, thereby forming flexible keyboard 20.

In embodiments where the entire outer surface of the keyboard, including the touch input elements, is made from the same material, the materials injected by the IML tool will have a dielectric constant above about 3. In embodiments where the touch input elements are made from a different material than the rest of the keyboard, the materials injected by the IML tool can have a dielectric constant below about 3, and will be disposed around the touch input elements during the IML process.

In some embodiments, IMD is utilized to form graphics layer 56 described above. In such embodiments, a graphic sheet or the like is placed inside the injection mould or cast prior to the introduction of fluid polymer. Once moulded, the layer becomes an integral part of the resultant structure.

Particular embodiments may provide one or more or none of the following technical advantages. Particular embodiments may provide a touch-based keyboard that is flexible, water-proof, light weight, and easy to clean. In addition, certain embodiments may provide a transparent keyboard that may be desirable to some users. Certain embodiments may provide one or more other advantages, one or more of which may be apparent to those skilled in the art from the figures, descriptions, and claims included herein.

Although the preceding examples given here generally rely on self capacitance or mutual capacitance to operate, other embodiments of the invention will use other technologies, including other capacitance measures, resistance, or other such sense technologies.

Herein, reference to a computer-readable storage medium encompasses one or more non-transitory, tangible computer-readable storage media possessing structure. As an example and not by way of limitation, a computer-readable storage medium may include a semiconductor-based or other integrated circuit (IC) (such, as for example, a field-programmable gate array (FPGA) or an application-specific IC (ASIC)), a hard disk, an HDD, a hybrid hard drive (HHD), an optical disc, an optical disc drive (ODD), a magneto-optical disc, a magneto-optical drive, a floppy disk, a floppy disk drive (FDD), magnetic tape, a holographic storage medium, a solid-state drive (SSD), a RAM-drive, a SECURE DIGITAL card, a SECURE DIGITAL drive, or another suitable computer-readable storage medium or a combination of two or more of these, where appropriate. A computer-readable non-transitory storage medium may be volatile, non-volatile, or a combination of volatile and non-volatile, where appropriate.

Herein, "or" is inclusive and not exclusive, unless expressly indicated otherwise or indicated otherwise by context. Therefore, herein, "A or B" means "A, B, or both," unless expressly indicated otherwise or indicated otherwise by context. Moreover, "and" is both joint and several, unless expressly indicated otherwise or indicated otherwise by context. Therefore, herein, "A and B" means "A and B, jointly or severally," unless expressly indicated otherwise or indicated otherwise by context.

Reference in the appended claims to an apparatus or system or a component of an apparatus or system being adapted to, arranged to, capable of, configured to, enabled to, operable to, or operative to perform a particular function encompasses that apparatus, system, component, whether or not it or that particular function is activated, turned on, or unlocked, as long as that apparatus, system, or component is so adapted, arranged, capable, configured, enabled, operable, or operative.

Although the present disclosure has been described above in connection with several embodiments, a myriad of changes, substitutions, variations, alterations, transformations, and modifications may be suggested to one skilled in the art, and it is intended that the present invention encompass such changes, substitutions, variations, alterations, transformations, and modifications as falling within the spirit and scope of the appended claims.

What is claimed is:

1. A flexible keyboard comprising:
   a flexible outer layer positioned to receive a touch input directly on the flexible outer layer, the flexible outer layer formed from a solidified material, the flexible outer layer comprising a top layer and a bottom layer; and
   a flexible touch sensor layer comprising a substrate and a plurality of electrodes coupled to at least one side of the substrate, the plurality of electrodes operable to detect touches of the flexible outer layer wherein the flexible touch sensor layer is sandwiched between the top layer and the bottom layer of the flexible outer layer;
   wherein:
      the flexible outer layer comprises a graphics layer indicating outlines of a plurality of keys;
      the flexible outer layer comprises a plurality of three-dimensional protrusions that protrude above a surface of the flexible outer layer; and
      a protrusion from among the plurality of three-dimensional protrusions corresponds to a key from among the plurality of keys.

2. The flexible keyboard of claim 1, wherein each particular electrode of the plurality of electrodes is formed by a plurality of flexible lines of metal having widths of about 2 μm to about 10 μm.

3. The flexible keyboard of claim 1, wherein each particular electrode of the plurality of electrodes is formed by a plurality of flexible lines of metal having widths of more than about 10 μm.

4. The flexible keyboard of claim 1, wherein:
   each particular electrode of the plurality of electrodes has a shape formed by a plurality of flexible lines of metal; and
   the flexible lines of metal comprise a hatched or mesh pattern that occupies less than 100% of the area of the shape of the particular electrode.

5. The flexible keyboard of claim 1, wherein the solidified material is a polymer with a dielectric constant greater than about 3.

6. The flexible keyboard of claim 1, wherein the solidified material is selected from the group consisting of polymer, rubber, and silicone.

7. The flexible keyboard of claim 1, wherein:
   the solidified material has a dielectric constant less than about 3; and
   the input device further comprises a touch input element having a dielectric constant greater than about 3.

8. The flexible keyboard of claim 1, wherein the plurality of electrodes comprises a plurality of sense electrodes and a plurality of drive electrodes, the plurality of sense electrodes disposed on a first side of the substrate and the plurality of drive electrodes disposed on a second side of the substrate that is opposite the first side.

9. The flexible keyboard of claim 1, wherein the flexible outer layer is opaque.

10. The flexible keyboard of claim 1, wherein the flexible outer layer is transparent.

11. The flexible keyboard of claim 1, wherein:
   at least one of the three-dimensional protrusions comprises a dial having a shape of a cylinder;
   a portion of the flexible touch sensor layer is disposed in the dial;
   the dial is operable to remain stationary while a user twists one or more fingers around an outer surface of the dial; and
   the portion of the flexible touch sensor layer that is disposed in the dial is operable to detect the one or more fingers twisting around the outer surface of the dial.

12. The flexible keyboard of claim 1, the outer layer further comprising a touch pad area, wherein:
- a portion of the flexible touch sensor layer is disposed under the touch pad area; and
- the portion of the flexible touch sensor layer under the touch pad area is operable to detect movements of a touch object as the touch object moves across the touch pad area.

13. The flexible keyboard of claim 1, wherein each particular electrode of the plurality of electrodes has a shape that is formed by a plurality of flexible lines of metal that are fine lines of metal (FLM), the flexible FLM comprising a hatched or mesh pattern that occupies between 1% and 10% of the area of the shape of the particular electrode.

14. The flexible keyboard of claim 1, wherein the flexible touch sensor layer is approximately 50 μm thick.

15. The flexible keyboard of claim 1, wherein the flexible outer surface is continuous and is impenetrable by water.

16. The flexible keyboard of claim 1, wherein:
- the plurality of electrodes comprises a plurality of sense electrodes and a plurality of drive electrodes; and
- either the plurality of sense electrodes or the plurality of drive electrodes are coupled to an underside of the top layer of the flexible outer layer.

17. The flexible keyboard of claim 1, wherein the flexible outer layer further comprises a plurality of touch input elements.

18. A flexible keyboard comprising:
- a flexible outer layer formed from a solidified material and comprising a top layer and a bottom layer; and
- a flexible touch sensor layer operable to detect touches directly on the flexible outer layer, the flexible touch sensor layer comprising:
  - a substrate;
  - a plurality of sense electrodes; and
  - a plurality of drive electrodes;

wherein:
- the plurality of sense and the plurality of drive electrodes are disposed on one side of the substrate;
- the flexible touch sensor layer is encompassed within the solidified material of the flexible outer layer;
- the flexible outer layer comprises a graphics layer indicating outlines of a plurality of keys;
- the flexible outer layer comprises a plurality of three-dimensional protrusions that protrude above a surface of the flexible outer layer; and
- a protrusion from among the plurality of three-dimensional protrusions corresponds to a key from among the plurality of keys.

* * * * *